United States Patent [19]

Kataoka et al.

[11] 4,204,179
[45] May 20, 1980

[54] MECHANISM FOR CHANGING INDUCTANCE OF A PUSH-BUTTON TUNER

[75] Inventors: Takeshi Kataoka; Hiroshi Matsumoto; Hisashi Matsui, all of Ueda, Japan

[73] Assignee: Ono Seiko Co., Ltd., Tokyo, Japan

[21] Appl. No.: 953,969

[22] Filed: Oct. 19, 1978

[30] Foreign Application Priority Data

Oct. 29, 1977 [JP] Japan .................................. 52-129854

[51] Int. Cl.² ........................... H03J 5/06; H03J 5/08; H03J 5/32
[52] U.S. Cl. ....................................... 334/7; 74/10.29; 74/10.33
[58] Field of Search ................ 334/7; 74/10.29, 10.31, 74/10.33, 10.37, 10.6

[56] References Cited

U.S. PATENT DOCUMENTS

| | | | |
|---|---|---|---|
| 3,247,728 | 4/1966 | Wolf et al. | 334/7 |
| 3,737,817 | 6/1973 | Ashida et al. | 334/7 |
| 3,863,509 | 2/1975 | Zimatore et al. | 334/7 |
| 4,020,704 | 5/1977 | Miyagi | 74/10.33 |
| 4,030,052 | 6/1977 | Pelletier | 334/7 |
| 4,099,421 | 7/1978 | Ohashi et al. | 74/10.37 |

Primary Examiner—Alfred E. Smith
Assistant Examiner—Robert E. Wise
Attorney, Agent, or Firm—Wenderoth, Lind & Ponack

[57] ABSTRACT

A mechanism for changing inductance of a push-button tuner which is constructed to be compact and flat in size as to be adapted for use with a tape recorder. The mechanism includes flat slidable cam plates provided with cam portions at the front portions thereof, which are arranged horizontally and slidably through holes of side walls and a push-button assembly slidably arranged in a front and a rear walls, which is equipped with a channeling plate pivotable thereon the position of which may be set at a desired angle by means of the operation of manual shaft when a clutch mechanism is closed. With the advancement of the push-button plate against a coil spring arranged at the end thereof, the projections positioned on the channeling plate set at desired angle collide with the cam portions of the slidable cam plates intermittently whereby the slidable cam plates are shifted conversely and the intermittent shifting movement of the cam plates thus created are transmitted to the foot of a core carriage by turns through a rotation means connected therewith with the result that the cores mounted on the carriage are shiftable back and forth with respect to the coil bodies whereby the variation of inductance is obtained.

3 Claims, 9 Drawing Figures

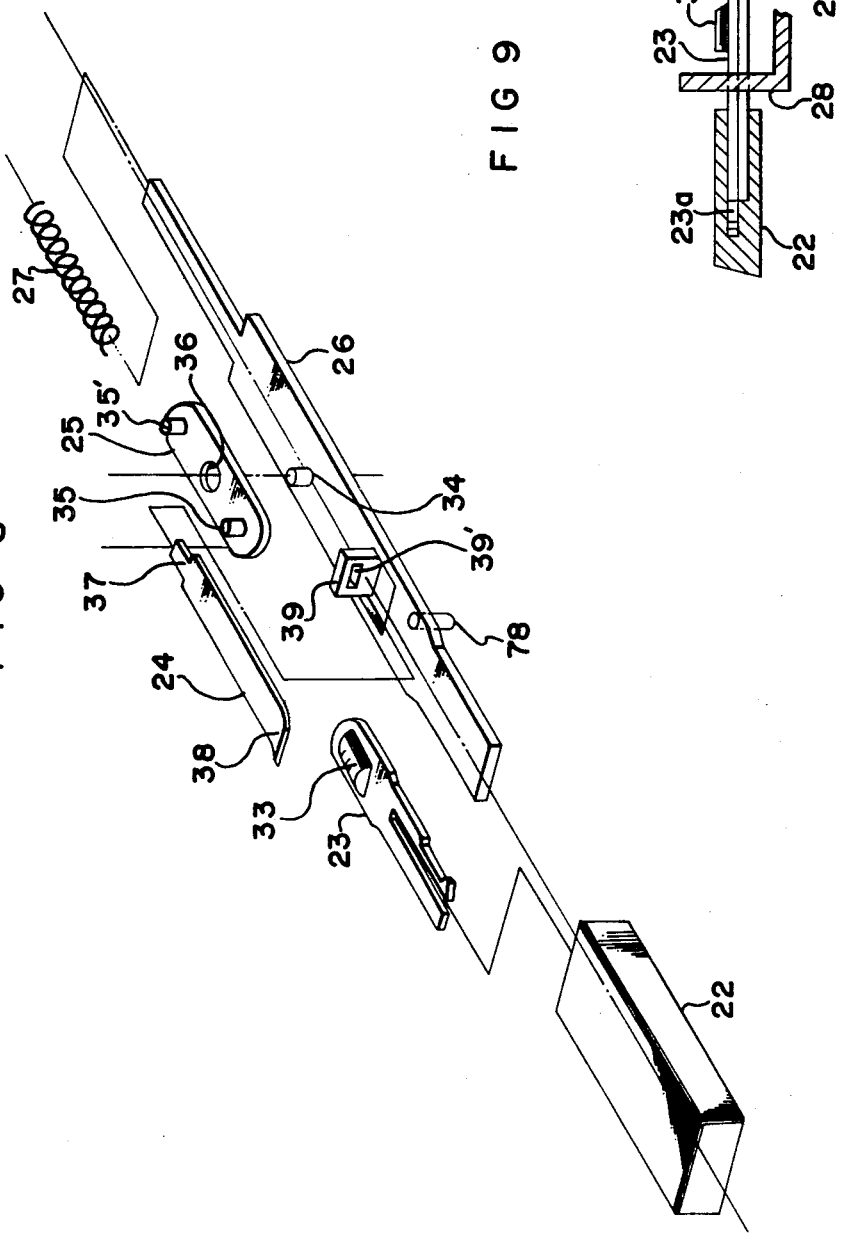

MECHANISM FOR CHANGING INDUCTANCE OF A PUSH-BUTTON TUNER

BACKGROUND AND BRIEF SUMMARY OF THE INVENTION

The present invention relates to the mechanism for changing inductance of a push-button type tuner, more specifically to a mechanism for changing inductance of a tuner which is so constructed as to be compact and flat in size as to be adapted for use with a tape recorder.

Conventionally, in push-button type tuners of the kind designed for installation in motor vehicles, there are provided a plurality of stationary coils and a similar number of tuning cores which are mounted on a core carriage and movable in and out of coil bodies to change inductance by a selective depression of push-button through a rotatable treadle-bar assembly and an additional manual tuning mechanism having a manually operative tuning shaft adapted to be rotated to change the inductance. In such a conventional tuner there is a metal mounting bracket which is rectangular in shape. The bracket comprises vertical side walls arranged in parallel, and vertical front and rear walls arranged in parallel and intersecting the side walls at right angle.

A push-button assembly is provided with a button plate slidably positioned through the front and the rear walls by means of biasing force of a coil spring mounted on the end thereof and with a crescent-shaped channeling plate retainable at a desired position thereupon. A comb-shaped rotary member is rotatably supported on the side walls by means of a horizontally extending shaft, and usually the teeth of the rotary member are located in a slightly frontwardly tilted position close to the front wall and are ready to touch depending projections disposed on the push-button.

A treadle-bar assembly is rotatably supported on the pair of vertical side walls by means of two shafts fixed to and extending from a pair of flat support members, to the inside of which are fixed a pair of parallel rods. With the forward advancement of the push-button, the crescent-shaped channeling plate is also advanced to collide with the pair of parallel rods of the treadle assembly, whereby the rotation angle of the treadle-bar assembly is set corresponding to the position of the channeling plate retained at a desired angle.

A manually operative shaft for a clutch mechanism is also mounted on the front side wall in a usual manner. The rotation of the treadle-bar assembly permits the core carriage on which cores are mounted to shift forward or backward whereby the cores are movable in and out of the coil body with the resultant changing of inductance as desired. However, this type of prior ones are fairly bulky and have not been preferable when arranged in combination with other machinery. Naturally it is almost impossible to reduce a physical thinness of the tuner as to be adapted for use in combination with a tape recorder.

Recent market situation presents us that there may be a considerable demand for tape recorders provided with a push-button tuner. Naturally, various types of mechanism available to meet the demand are now being searched, which requires such a type of tuner as having an optimum physical thinness to be compatible with the tape recorders.

It is an object of the present invention to provide a tuning mechanism which is so designed as to have an optimum thinness, which is flat in shape but capable of maintaining a correct tuning.

It is another object of the invention to provide a push-button mechanism which permits a smoother but accurate function of the flat type tuner.

It is still another object of the invention to provide a pair of cam plates alternatingly slidable with each other which is so constructed as to shift a core carriage whereby cores mounted thereon go in and out of a corresponding coil body so that a correct tuning may be performed.

It is a further object of this invention to provide a simple declutch mechanism equipped with lever means which performs a smooth and accurate declutching operation of a push-button type tuner.

Other and further objects, features and advantages of the invention will appear more fully from the following description.

BRIEF DESCRIPTION OF THE DRAWINGS

FIG. 8 is an exploded, perspective view of the push-button assembly.

FIG. 9 is a partially sectional view of the push-button with a part of push-button plate and a sliding metal plate.

DETAILED DESCRIPTION

The inductance changing mechanism of this invention will be described hereinafter, with specific reference to the drawings.

Figure 1:
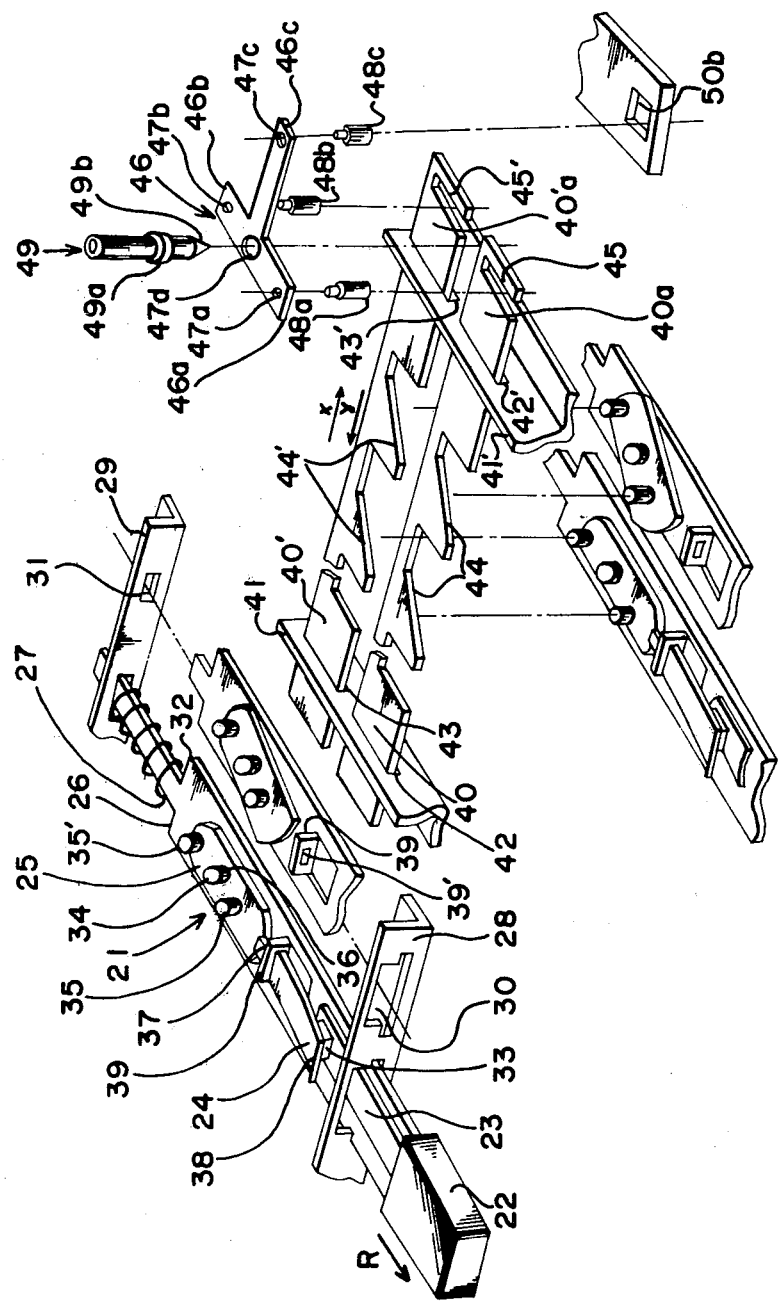
FIG. 1 is an exploded, perspective view illustrating the push-button assembly, the slidable cam plate, and the rotation means for shifting the core carriage of the tuner according to this invention with the case thereof removed.

Referring to FIG. 1 and FIG. 8 a push-button assembly 21 comprises a push-button 22, a sliding metal plate 23, a retaining plate 24, a channeling plate 25, a flat push-button plate 26 and a coil spring 27, the details of which will be described hereunder.

A front wall 28 and a rear wall 29 are mounted in parallel on a horizontal flat frame base 86, while a side walls 41, 41' are also arranged in parallel and at right angle to the front and rear walls 28 and 29.

The flat push-button plate 26 one end of which is fixedly inserted in a push-button 22 is arranged horizontally and slidably through rectangular holes 30, 31 disposed in the front wall 28 and the rear wall 29 respectively.

The coil spring 27 is received on the flat push-button plate 26 between the rear wall 29 and a stepped edge 32 of the push-button plate and urges the push-button plate 26 back to the initial position by its biasing force whenever the depression of the push-button 22 is released.

Numeral 23 indicates a sliding metal plate having a convexed cam 33 arranged on one end thereon is slidably retained in a groove 23a in the push-button 22, and moves forward or backward slidably on the surface of the push-button plate 26 in the lengthwise direction thereof, when pushed or released by the push-button 22, until the cam 33 is positioned underneath or out of a retaining plate 24.

A channeling plate 25 is provided with a pair of projections 35, 35' thereupon and a hole 36 is disposed in the center thereof through which a shaft 34 mounted on the push-button plate 26 is previously positioned, thereby the channel plate 25 is rotatable with the shaft 34 as an axis. A retaining plate 24 which is of an resilient leaf spring is consisted of an L-shaped end 38 and a narrower end 37 which is extended to touch on the surface of the channeling plate 25 through a hole 29' arranged in a vertical wall 39 which is integrally formed on the push-button plate 26. Whenever the cam 33 of the sliding metal plate is located underneath the retaining plate 24, as is shown in FIG. 1, the convexed cam 33 pushes the end 38 upward and the other end 37 downward with the vertical wall 39 as a fulcrum, whereby the channeling plate 25 is unmovably retained by the retaining plate 24 at a desired position on the surface of the push-button plate 26.

A depending foot 78 mounted on under surface of the push-button plate 26 is so devised as to slide along the face of the cam 77 for clutch slide plate 76 (see FIGS. 5 and 8) as will be explained in detail hereinafter.

Numerals 40, 40' indicate flat sliding cam plates horizontally and slidably supported by vertical side walls 41, 41' through rectangular holes 42, 42', 43, 43' arranged therein respectively.

These sliding cam plates 40, 40' are provided at their front portions with a plurality of cam 44, 44' respectively, corresponding to the push-button assembly 21 in numbers and in positions. Portions 40a, 40'a which are protruding outside the vertical side wall 41' through rectangular holes 42', 43' respectively are provided with elongated slits 45, 45' arranged in parallel with the side walls.

A rotation means is generally indicated by numeral 46. It is shaped in the form of a letter T having two arms 46a, 46 and a foot 46c in which holes 47a, 47b and 47c are positioned respectively, while a center hole 47d is disposed in the central part of the arms between two holes 47a and 47b. Three depending studs 48a, 48b, 48c are fixedly inserted in the holes 47a, 47b, 47c respectively. These depending studs may be replaced by pivots arranged on the rotation means.

Numeral 49 indicates a rotation shaft having a pointed end 49b at one end and a female threaded bore 49' arranged in the other end thereof and an annular ring 49a is formed integrally therewith. The rotation shaft 49 may be assembled with the rotation means 46, by the insertion of pointed end 49b through the hole 47d until the under surface of the annular ring 49a touches the surface of the rotation arm, thereby the both components are unitarily connected.

Figure 2:
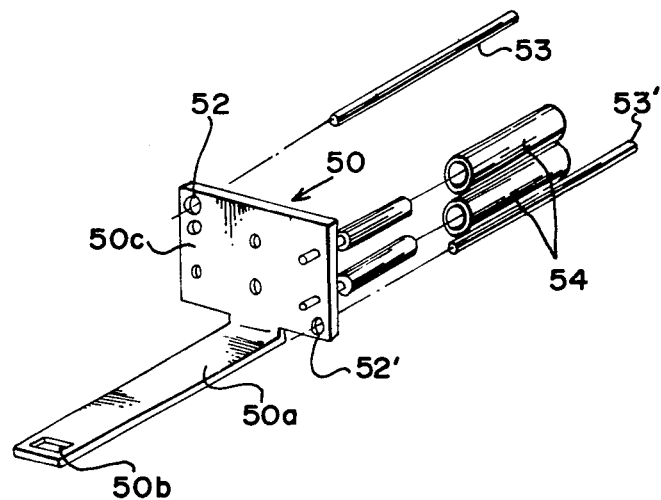
FIG. 2 illustrates a perspective view of the core carriage and its associated members.

An L-shaped core carriage 50 (FIG. 2) comprises a vertical wall 50c having holes 52, 52' for guide shaft 53, 53' and a foot 50a provided with a hole 50b at its end. A plurality of cores 51 are horizontally mounted on the vertical wall 50c which is supported by guide shafts 53, 53', thereby the core carriage 50 is devised to be slidable in the lengthwise direction of the guide shafts with the result that the cores 51 may be shiftable with respect to coil bodies 54.

The rotation means 46, the slidable cam plates 40, 40' and the core carriage 50 are assembled in the following manner.

Out of three depending studs of the rotation means 46, two studs 48a and 48b are positioned to engage with the slits 45, 45' respectively while the remaining stud 48c, with the hole 50b of the core carriage foot 50a, Naturally, the pointed end 49b of the rotation shaft 49, when assembled as above is vertically located at spaced arranged between the slidable cam plates 40, 40'.

The push-button assembly 21 is positioned at a lower level than the slidable cam plates 40, 40' and intersectional with said slidable cam plates at right angles. A pair of projections 35, 35' arranged on the channeling plate 25 are touchable with the cams 44, 44' of the cam plates respectively, when the push-button assembly advances forward.

The operation of changes in inductance according to this invention will be explained hereunder.

Figure 3:
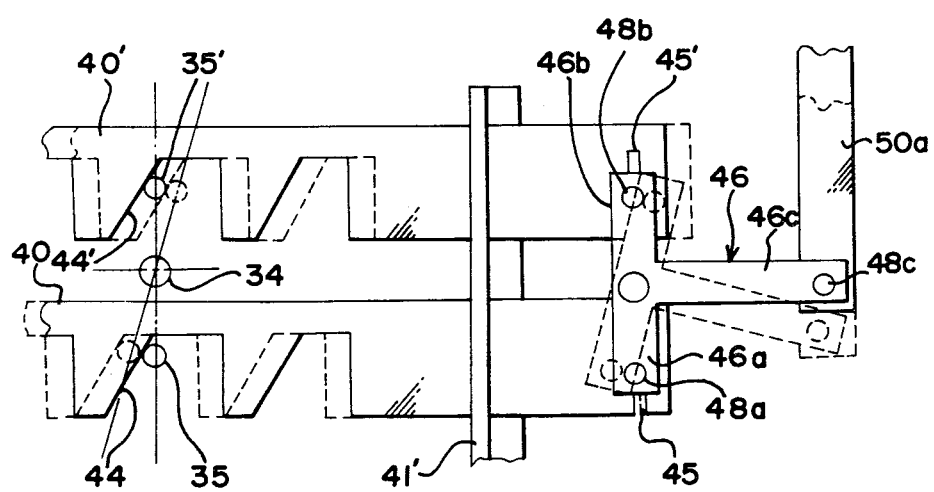
FIG. 3 is a plan view of the slidable cam plate and the rotation means with shifted position shown by dotted lines.

When the push-button plate 26 is advanced forward against the coil spring 27 by depressing the push-button 22, either of the projections 35, 35' disposed on channeling plate 25 which is unmovably retained at a desired position by the retaining plate 24 as is shown in FIG. 1, touches either of the cams 44, 44' defined at the front part of sliding cam plates 40, 40'. As the push-button plate is further advanced, the channeling plate 25 is also so advanced such that one of the projections, for example, the projection 35 shifts slidably along the face of cam 44 thereby the sliding cam plate 40 moves in the direction of arrow Y. With the movement of the sliding cam plate 40, one of the stud 48a of the rotation means 46 engaging in the slit 45 moves simultaneously therewith in the same direction, while the other stud 48b engaging in the slit 45' is pushed to shift in the reverse direction together with the sliding cam plate 40' until the projection 35' of the channeling plate touches the cam 44'. FIG. 3 illustrates the mechanism heretofore explained, wherein dotted lines indicate the positions thus shifted.

Thus, an intermittently touching of the projection 35 or 35' with the cam 44 or 44' defined in the slidable cam plate 40 or 40' brings forth an alternating shifting thereof conversely whereby the rotation means 46 connected with the rotation shaft 49 rotates according to the shifting thereof with the result that the foot 46 for a depending stud 48c which is engaging with the hole 50b disposed in the foot 50a of the core carriage 50, changes its position as shown by dotted lines in FIG. 3. In accordance with the movement of the rotation means 46, the core carriage 50 which is slidably supported by guide shafts 53, 53' is so devised as to shift forward or backward simultaneously therewith, whereby the cores 51 are shiftable with respect to the coil bodies 54 with result that the correct variation of inductance is obtained.

As can be understood by the foregoing description, the mechanism makes it possible to attain an accurate change in inductance and is so constructed as to reduce the height of the tuner at the optimum i.e. the tuner of thin type provided with a inductance variation mechanism may be obtained.

The clutch mechanism will be described hereinafter referring to FIG. 4 through FIG. 6.

A clutch lever support 58 consists of a plate which is bent to form symmetrically stepped portions. More specifically, the clutch lever support has a first flat portion 58a having therethrough a hole 59 provided with a vertical inner wall 59a, a second flat portions 66 and vertical portions 58 bent perpendicularly to the flat portion. The vertical portions 58 each has a rectangular hole 60.

A gear wheel 55 has a peripheral gear 55 and is provided with a bearing 56 having a vertical wall 56a which is of the same size with the vertical wall 59a of clutch lever 59, bearing 56 being concentric and unitary therewith and projecting vertically therefrom. A round hole 57 is formed extending through the bearing 56 which is press-fitted into the hole 59, whereby the clutch lever support 58 and the gear wheel 55 are connected each other, both vertical walls 59a touching face to face.

A disc 61 has a central hole 62 of a diameter smaller than that of the rotation shaft 49. An upper shaft 69 of the same diameter as the rotation shaft 49 has at one end thereof a male screw of a smaller diameter adapted to be received by the hole 62 and then to be engaged by a female threaded bore 49' in one end of the rotation shaft 49 concentrically therewith, whereby the disc 61 is fixed between the upper shaft 69 and the rotation shaft 49. Two pairs of clutch levers 23 (in this embodiment only a pair of clutch lever 63 being illustrated, hereinafter description on the remaining two levers being eliminated) are formed by bending respective flat plates into L-shapes having vertical portions 67 and apex portions 64. Each clutch lever is provided with a projection 65 at its end thereon and a cut-out portion 63a arranged at its one side.

As mentioned before, the disc 61 is fixed between the upper shaft 69 and the rotation shaft 49. When the clutch mechanism is in closed state, the disc 61 is in contact with the second flat surface portions 66 of the clutch lever support 58. In this state, the vertical walls 67 are received by the rectangular holes 60 of the clutch lever support, while the projection 65 may be located at the outer side of the disc 61, while the cut-out portions 63a receive the shaft 69.

In addition, after being assembled to locate the upper shaft 69 through the cut-out portions of the clutch lever 63, a collar 68 is fitted around the shaft 69 through its hole 68a with one face of the collar touching the clutch lever 63.

A lever plate 71 consisting of a piece of plate bent into an L-shape has a central hole 75 which is so devised to receive the upper shaft 69, the L-shape being consisted of a horizontal panel 71b and a vertical panel 71a. The horizontal panel 71b is provided with arms 74 and 74' having therein outwardly opened grooves 74a and 74b respectively. The arms 74, 74' are separated from each other by a groove 74c which is formed narrower as it goes towards the ends of the arms. The upper shaft 69 is passed through the central hole 75 provided in the lever plate 71, and the pair of arms 74, 74' on the horizontal panel 71b are also passed through a rectangular bore 73 provided in a vertical bracket 72, arranged on a base 86.

Then, either or both of the arms 74, 74' are deformed to make the groove 74c broader, by means of a screwdriver or the like, so that the grooves 74a, 74b on the arms may be brought into engagement with the inner edges of the rectangular bore 73, whereby the lever plate 71 is fixed to the bracket 72.

A coil spring 81 is bridged by means of hooks 81a, 81b thereof between a hook 71b' disposed on one side of the lever plate 71 and a hole 41'a in the side wall 41'.

Numeral 71a' is a cam portion defined at the edge of the vertical panel 71a of the lever plate, which will be lifted up, by means of clutch sliding plate 76 located thereunder about a fulcrum created at the point where the lever plate arms 74, 74' are received by the bore 73 in the bracket 72.

Figure 4:
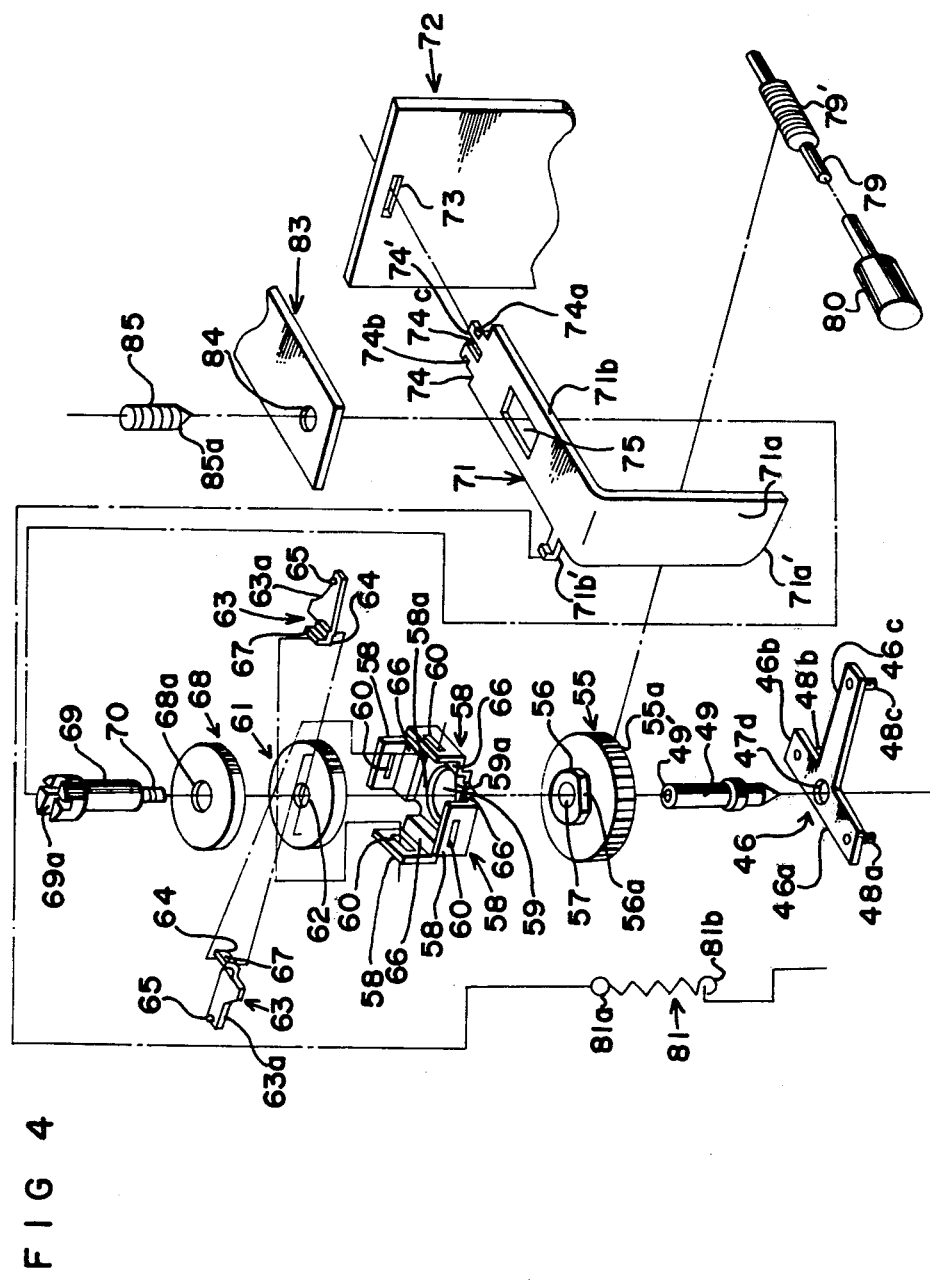
FIG. 4 is an exploded, perspective view of the clutch mechanism according to the invention whereby a sliding plate and a depending foot are not shown.

Numeral 83 indicates a supporting plate provided with a female threaded bore 84 devised to be engaged by a male screw shaft 85 having a pointed end 85a which is pressing onto a crossed groove or bore 69a arranged on top of the upper shaft 69, as is shown in FIG. 4.

A clutch sliding plate 76 which is positioned at a lower level than the push-button plate 26 in front of the sliding cam plates 40, 40' in parallel therewith. As seen facing to FIG. 5, is slidably supported by the side walls 41 and 41'. The sliding plate 76 is also provided with cam portions 77 and a coil spring 76b whose biasing force urges the sliding plate 76 in the direction of side wall 41.

One end 76a of the sliding plate 76 is so devised as to be slidingly touchable with the end cam 71a' of the lever plate 71 when the sliding plate 76 is shifted in the direction of arrow Q by means of the depending foot 78, as will be explained hereinafter.

A worm gear shaft 79 provided with a worm gear 79a and a manual shaft 80 are constructed in a conventional manner. The worm gear shaft 79 rotatably supported by a U-shape 79a arranged on the base 86 so that the worm gear 78' may be in meshing engagement with the gear 55a of the gear wheel 55. The rotation of the manual shaft 80 on a hanger plate 80a is transmitted to the worm gear shaft 79 by the medium of two meshing gears 80b and 79b disposed at the end of the manual shaft 80 and the worm gear shaft 79 respectively.

The operation of the clutch mechanism will be explained hereunder.

When the clutch mechanism is in the closed state, the coil spring 81 biases the lever plate 71 downward to the base 86. The biasing force is applied to collar 68 through the lever plate 71 and is also transmitted to the clutch lever 63, which is fixed between the upper shaft 69 and the rotation shaft 49. Consequently, the disc 61 is pressed onto the clutch lever support 58, by the operation of the clutch lever 63 supported on the fulcrum point created at the point where the apex portion 64 of the bent clutch lever 63 engages the disc 61 and is in contact with the second flat portion 66, as was heretofore explained in detail, whereby the clutch lever support 58 and the disc 61 are simultaneously and rotatably arranged with the rotation shaft 49 unitarily connected with upper shaft 69.

The rotation of the manual shaft 80 transmitted to the worm gear shaft 79 through the gears 80b, 79b permits the driving of the gear wheel 55 by the worm gear 79'. Since the clutch mechanism is in the closed or clutched state, the rotation of the gear wheel 55 imparts the rotation to the upper shaft 69 unitarily connected with the rotation shaft 49 to rotate through the clutch lever support 58 and the disc 61.

Consequently, the rotation means 46 becomes rotatable with the rotation shaft 49 as an axis, whereby the sliding cam plates 40, 40' slidably supported by side walls 41, 41' shift conversely each other corresponding to the movement of the depending studs 48a, 48b engaging with the slits 45, 45' disposed in the sliding cam plates 40, 40'. Simultaneously, the movement of the foot 46c thereof is transmitted to the core carriage 50 through the depending stud 48c which is in engagement with the hole 50b arranged in the foot 50a thereof whereby the core carriage 50 shifts back and forth with the result that the cores 51 goes into or out of the coil bodies 54.

Thus the performance of manual operation, i.e. the manual variation of the inductance may become possible.

Figure 5:
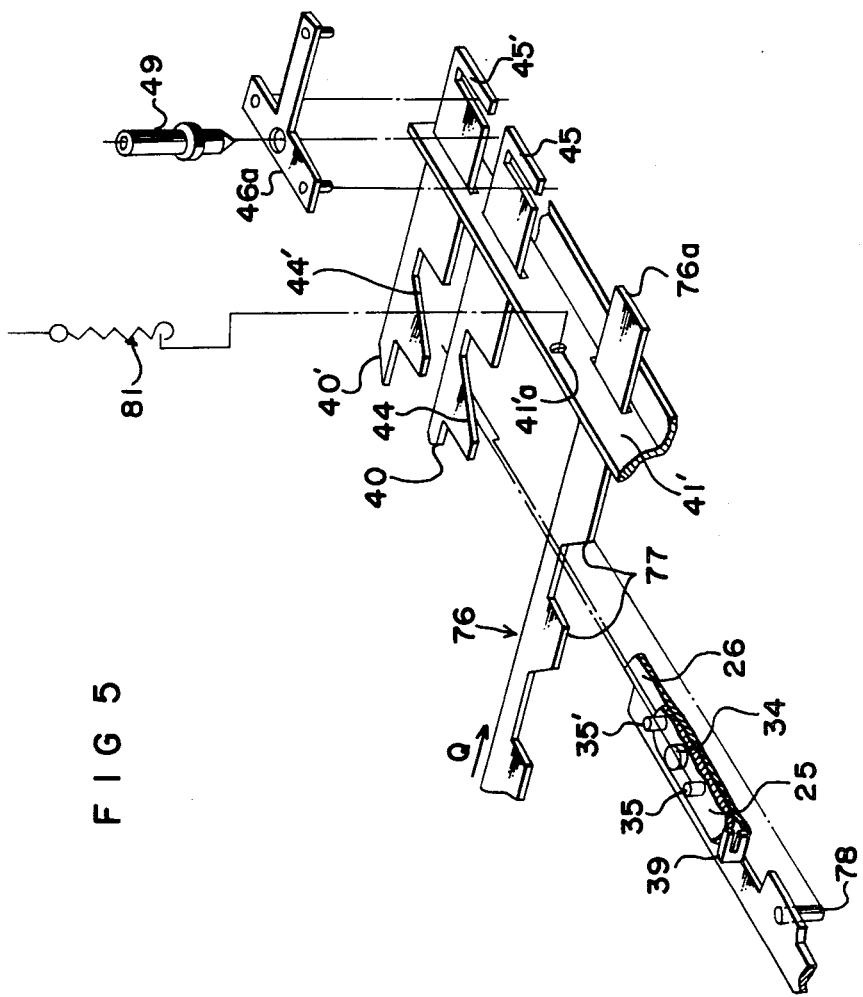
FIG. 5 is an exploded, perspective view illustrating a part of clutch mechanism partially cut away.
Figure 6:
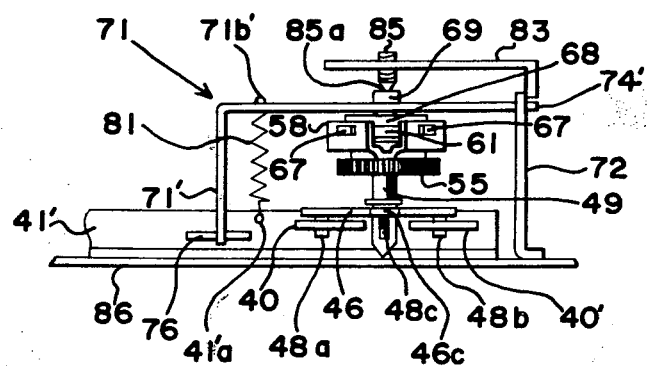
FIG. 6 is a side view of the clutch mechanism.
Figure 7:
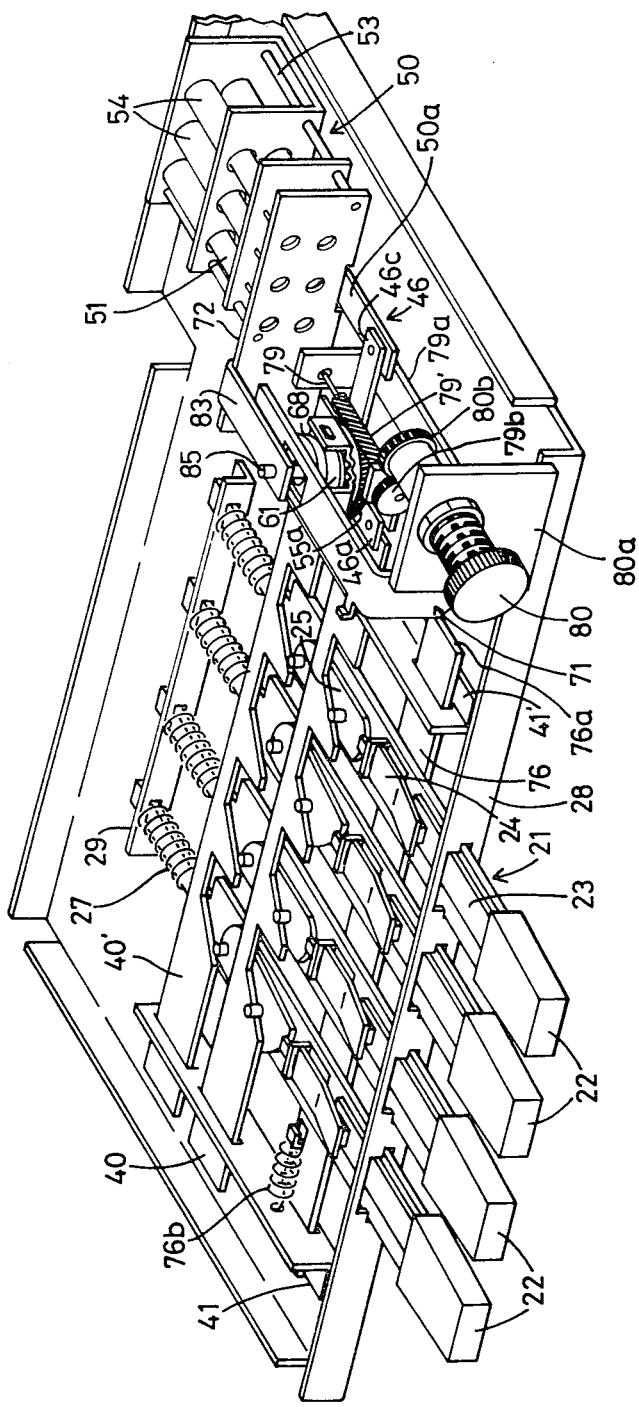
FIG. 7 is a perspective view of the mechanism for changing inductance according to the invention with the case thereof removed

Now, referring to FIGS. 1 and 5, the push-button assembly 21 is pulled out in the direction of arrow R and the retaining operation by means of the retaining plate 24 on the channeling plate 25 is released.

When the push-button 22 is depressed forward together with the push-button plate 26 against the coil spring 27, the depending foot 78 arranged under surface of the push-button plate 26 contacts slidably along the cam portion 77 of the clutch sliding plate 76, whereby the clutch sliding plate 76 is forced to shift in the direction of arrow Q against the coil spring 76b.

The end 76a of the clutch sliding plate makes a sliding touch with the cam portion 71a' of the lever plate 71 whereby the lever plate 71 is lifted up against the coil spring 81 to move away from the collar 68.

Thus the biasing force of the coil spring 81, working on the collar 68 and the clutch lever 63 is released, and naturally the pressing force of the lever support 58 and the clutch lever 63 onto the disc 61 sandwitched therebetween is dismissed.

Consequently, upon the rotation of manual tuning shaft 80, only the gear wheel 55 and the clutch lever support 58 can be rotated with the rotation shaft 49 as an axis, therefore the shifting of core 51 with respect to the coil bodies 54 through the rotation means 46 will never be effected, because the disc 61 is disconnected with the clutch lever support 58 through the clutch levers 63.

And as the push-button plate 26 is advanced either of the projections 35, 35' of the channeling plate 25 already set at a desired position touch with either of the cams 44, 44' of the sliding cam plates 40, 40', whereby either of the sliding cam plates 40, 40' is shifted in the direction of arrow X or Y, as heretofore explained with the result that the advancement of the push-button plate 26 is suspended.

As explained above, whenever the lever plate 71 is tilted away from the collar 68 by the operation of the clutch sliding plate 76, the pressing force of the lever support 58 onto the disc 61 is dismissed thereby the shifting of the sliding cam plates 40, 40' become easy by an external force applied i.e. the movement of the cores 51 with respect to the coil bodies 54 is performed with ease through the rotation means 46.

With the further advancement of the push-button plate 26 the channeling plate 25 is also so advanced as to allow the both projections 35, 35' to collide with the corresponding cams 44, 44' whereby the position of both sliding cam plates 40, 40' are set by shifting thereof corresponding to the desired position of the channeling plate 25 and the shifting of core 51 with respect to the coil body 54 is easily attained through the rotation means 46. The inductance is thus changed by reproducing the rotation angle of the channeling plate 25.

Subsequently, as the depression force of the push-button plate is released, the push-button assembly 21 returns to the initial condition due to the biasing force of the coil spring 27, and the clutch sliding plate 76, the sliding cam plates 40, 40' and the lever plate 71 are also returned to their initial positions. The biasing force of the coil spring 81 acts again on the collar 68 with the result that the clutch lever support 58 and disc 61 are pressed against each other by means of clutch levers 63, as heretofore explained. Thus, the clutch mechanism is in the clutched or closed state, with the correct position of the core 51 with respect to the coil body 54 being maintained.

When the clutch mechanism is in the closed state, the rotation of the manual shaft 80 imparts rotation to the clutching members such as clutch lever support 58, the disc 61 unitarily connected between the upper shaft 69 and the rotation shaft 49 and the rotation means 46 through the worm gear 79' meshing with the gear wheel 55, whereby the position of the sliding cam plates 40, 40' and the core carriage 50 can be set at a desired position.

As soon as the position of the sliding cam plates is set as heretofore explained, the push-button 22 provided with the sliding metal plate 23 having the cam 33 thereon is pulled out in the direction of arrow R (see FIG. 1), whereby the cam 33 may be shifted to get out of the retaining plate 24, and the retaining force by the narrow end 37 on the surface of the channeling plate 25 is released thereby the channeling plate 25 becomes rotatable freely.

With the depression of push-button 22, the push-button assembly 21 advances against the coil spring 27 and the projections 35, 35' may touch with the corresponding slidable cam plates 40, 40' already set at the desired position. However, in this state, the clutch mechanism is still in the closed state because the sliding metal plate 23 is still set free and the depending foot 78 disposed on the under surface of the push-button plate 26 does not function to lift up the clutch sliding plate 76.

With the further advancement of push-button 22, the cam 33 of the sliding metal plate 23 slides into the under surface of the retaining plate 24 provided with the narrow end 37 which in turn retains the channeling plate 25 at the desired position on the push-button plate 26, whereat the projections 35, 35' are set by colliding with the sliding cam plates 40, 40' respectively, the position of which have already been determined, as was heretofore explained.

Thus the positioning of the channeling plate 25 at a desired rotation angle may be obtained with accuracy and easiness.

The tuner provided with the mechanism of this invention is compact and thin in size and is so devised as to permit an accurate and easy operation of setting the channeling plate at a desired position. The correct maintenance of the cores at the selected position with respect to coil bodies is also ensured and the correct variation of inductance can be attained.

As heretofore explained, this invention provides various advantages and uses over conventional mechanism.

While but a single embodiment of the invention is therein disclosed, it will be appreciated that many variations may be made in the details thereof without departing from the spirit and scope of the invention as defined in the following claims.

We claim:

1. A mechanism for changing inductance of a tuner comprising: a push-button assembly having a push-button plate provided with a push-button at one end and a coil spring received thereon at the other end thereof, which is arranged horizontally and slidably through rectangular holes disposed in the front and the rear walls positioned in parallel on a base respectively, and on which a channeling plate provided with a pair of projections is pivotably positioned, said channeling plate being retainable at a desired position by means of a retaining plate supported by a vertical wall positioned on the push-button plate, under which a sliding metal plate having a convexed cam thereon is arranged slidably in lengthwise direction of the push-button; a pair of sliding cam plates arranged horizontally and slidably through rectangular holes disposed in a pair of side walls arranged on the base at right angles to said front and rear walls, said sliding cam plates being provided with cam portions with which the projections for the channeling plate are collidable intermittently when the push-button plate is advanced by the depression of the push-button hereby to permit the sliding cam plate to be shifted conversely through a rotation means; a rotation means formed in a letter T having a pair of depending studs engageable with slits arranged in the portions of the sliding cam plates protruding through holes arranged in one of the vertical walls and another depending stud also engageable with a hole for a core carriage foot; a rotation shaft provided with a pointed end and an annular ring formed integrally therewith being connected with the rotation means by the insertion of said pointed end through a hole positioned in the center between said pair of depending studs with the under surface of said annular ring touching with the surface of the rotation means; a core carriage comprising a vertical wall having holes for horizontal guide shaft, a foot provided with a hole at its end with which one of the depending studs of the rotation means being engageable and a plurality of cores horizontally mounted thereon, said core carriage being so arranged slidable back and forth corresponding to the sliding movement of the sliding cam plates through the rotation means and the rotation shaft connected with each other as to allow the cores to be shiftable with respect to coil bodies arranged at the back of the core carriage with the resultant changing of inductance of the tuner; a clutch sliding plate provided with cam portions at front portion thereof being arranged horizontally and slidably through the side walls so that the end portion thereof may slide along the under surface of an end cam portion of an L-shaped lever plate mounted on a bracket, against the biasing force of coil spring positioned on the clutch sliding plate hereby to lift up or tilt the lever plate away from the base when a depending foot of the push-button plate engages with a cam portion of the clutch sliding plate by the forward advancement of the push-button, with the resultant declutching of a clutch mechanism; and a manual tuning shaft mounted on a hanger plate the rotation of which is transmitted, through two meshing gears disposed at the end of manual shaft and worm gear shaft, respectively, to a worm gear shaft which is in meshing engagement with a gear or a gear wheel constituting a part of the clutch mechanism, the gear wheel being arranged rotatable simultaneously with the rotation means by means of the manual tuning shaft, whenever the clutch mechanism is closed, through other members of the clutch mechanism, hereby to permit the sliding cam plates to be shifted conversely.

2. The mechanism for changing inductance of the tuner as claimed in claim 1, wherein the push-button assembly comprises the push-button plate, one end of which is fixedly inserted in the push-button, the coil spring received on the push-button plate between the rear wall and a stepped edge of the push-button, which is urging the push-button assembly in the direction of the front wall, a channeling plate having a pair of projections thereon and a hole disposed in the center thereof through which a shaft mounted on the push-button plate is pivotably positioned and retainable at a desired position by means of the retaining plate and the sliding metal plate, the retaining plate which is of a resilient leaf spring being consisted of an L-shaped end and a narrow end which is extended to touch on the surface of the channeling plate through a hole in a vertical hanger wall integrally formed on the push-button plate, the sliding metal plate having a convexed cam at one end thereon, which is slidably retained in a groove in the push-button and moves forward or backward on the surface of the push-button plate in lengthwise direction thereof when pushed or released by the push-button until the convex cam is positioned underneath or out of the retaining plate, thereby to retain the channeling plate at a desired position by the narrow end of the retaining plate or to release the retention and the depending foot mounted on the under surface of push-button plate which is engageable with a cam portion of the clutch sliding plate by the forward advancement of the push-button hereby to lift up or tilt the lever plate away from the base.

3. The mechanism for changing inductance of the tuner as claimed in claim 1, wherein the sliding cam plates are provided at their front portions with a plurality of cams corresponding to the push-button assembly in numbers and in positions in the portions of which protruding through the vertical side walls are arranged elongated slits in parallel therewith in which two depending studs for the rotation means are slidably inserted, wherein the rotation means is shaped in the form of letter T equipped with two arms and a foot in which are arranged holes through which depending studs are fixedly inserted respectively, while a central hole is positioned in the central part of two arms, through which a pointed end of the rotation shaft is insertable, and wherein the rotating shaft is provided with a pointed end at one end, a female threaded bore in the other end thereof and an annular ring formed integrally therewith, the rotation shaft being assembled with the rotation means by the insertion of pointed end of the former through the central hole of the latter until the under surface of the annular ring touches the surface of the rotation means.

* * * * *